United States Patent [19]
Dahlin et al.

[11] Patent Number: 5,734,156
[45] Date of Patent: *Mar. 31, 1998

[54] OPTICAL DEVICE ASSEMBLY AND ITS PREPARATION USING METALLIC BUMP BONDING AND A STAND-OFF FOR BONDING TOGETHER TWO PLANAR OPTICAL COMPONENTS

[75] Inventors: Michael J. Dahlin, Santa Barbara; Jose A. Santana, Goleta, both of Calif.

[73] Assignee: Santa Barbara Research Center, Goleta, Calif.

[*] Notice: The term of this patent shall not extend beyond the expiration date of Pat. No. 5,689,106.

[21] Appl. No.: 625,674

[22] Filed: Mar. 29, 1996

Related U.S. Application Data

[63] Continuation-in-part of Ser. No. 361,622, Dec. 22, 1994.
[51] Int. Cl.$^6$ ........................................................ H01J 3/14
[52] U.S. Cl. ............................... 250/216; 250/239; 257/433
[58] Field of Search ................................. 250/216, 226, 250/239, 551, 208.1, 214.1; 257/433, 432, 81, 99; 359/66–69

[56] References Cited

U.S. PATENT DOCUMENTS

| | | | |
|---|---|---|---|
| 4,943,491 | 7/1990 | Norton et al. | 250/332 |
| 5,365,088 | 11/1994 | Myrosznyk | 257/186 |
| 5,380,669 | 1/1995 | Norton | 250/372 |
| 5,436,492 | 7/1995 | Yamanaka | 257/433 |

*Primary Examiner*—Que Le
*Attorney, Agent, or Firm*—W. C. Schubert; W. K. Denson-Low

[57] ABSTRACT

An optical device assembly includes a planar optical filter and a planar sensor having an optically active area. The optical filter and the sensor are joined together with a gap therebetween by a standoff structure extending between the optical filter and the sensor. The standoff structure is positioned at a location outside of the optically active area of the planar sensor. The standoff structure includes a standoff element, a first bonding element between the standoff and the filter, and a second bonding element between the standoff and the sensor. The two bonding elements each preferably comprise a cold-weldable indium bump. If the standoff structure, the filter, or the sensor is made of a material to which indium does not readily cold weld, a bonding pad of a material such as titanium/nickel can be inserted to facilitate the cold welding.

17 Claims, 4 Drawing Sheets

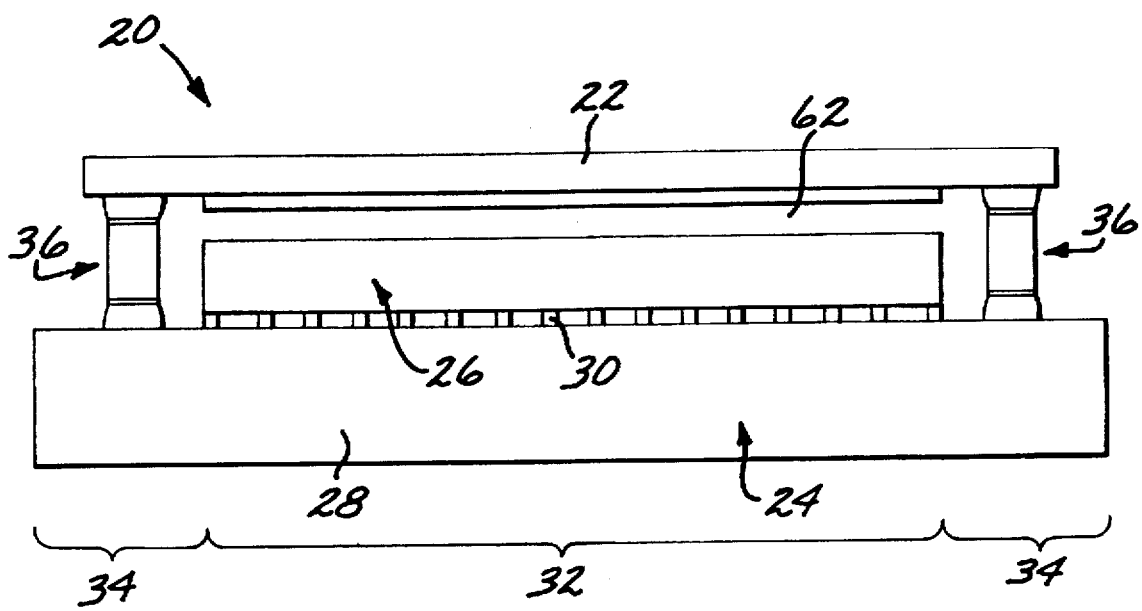
FIG. 1
FIG. 2
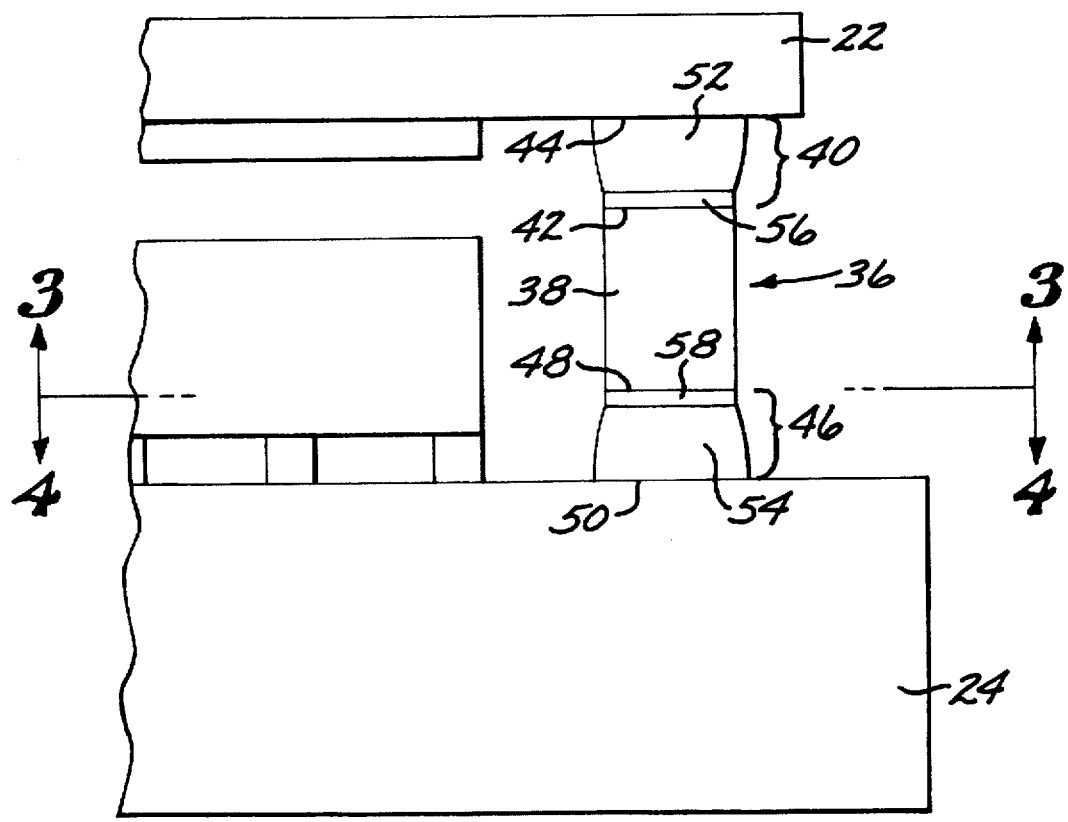

OPTICAL DEVICE ASSEMBLY AND ITS PREPARATION USING METALLIC BUMP BONDING AND A STAND-OFF FOR BONDING TOGETHER TWO PLANAR OPTICAL COMPONENTS

This application is a continuation-in-part of pending application Ser. No. 08/361,622, filed Dec. 22, 1994.

BACKGROUND OF THE INVENTION

This invention relates to the assembly of optical components into a device, and, more particularly, to such a device in which components are precisely positioned and joined together in a parallel, spaced-apart relationship.

The fabrication of optical devices sometimes requires that certain substantially planar optical components be joined together to each other in a parallel arrangement. As an example, in one type of sensor, a planar optical filter is positioned adjacent and parallel to a planar sensor chip having a thick detector thereon. The two components are separately fabricated and assembled in this arrangement. In operation of the assembled device, light passes through the filter to reach the sensor.

In the conventional assembly approach, a thin layer of a curable, transparent adhesive such as an epoxy is placed between the two components. The components are pressed together with the aid of appropriate tooling to a desired spacing prior to curing of the adhesive. After curing, the components are permanently bonded together with the layer of adhesive.

While operable, this fabrication technique has drawbacks. The adhesive bonding approach has relatively loose assembly tolerances in both the direction lying in the plane of the components and in the spacing between the components. The assembly time is relatively long, on the order of 12 hours, due to the need to at least partially cure the adhesive in the tooling. In operation of the device, the light reaching the sensor must pass through the adhesive layer, which attenuates and possibly distorts the light. The contact of the cured adhesive to the faces of the optical components can adversely affect their service lives.

Thus, there is a need for an improved approach for assembling such proximal filter/sensor devices, and other types of devices having the same requirements. The present invention fulfills this need, and further provides related advantages.

SUMMARY OF THE INVENTION

The present invention provides an optical device assembly and a method for its preparation. The approach is preferably used with an optical device assembly including a filter and a planar sensor having a relatively thick—0.001 inch or more—detector supported thereon facing the filter. The in-plane and perpendicular component tolerances are significantly smaller than those for the adhesive bonding approach. Assembly time is short, on the order of 1 hour, thereby reducing the cost of the product. There is no adhesive or other foreign material touching the faces of the components or lying between the components, so that long-term degradation is reduced and there is no obstacle in the optical path of the device resulting from the presence of foreign material. The present invention thus achieves both reduced cost and improved electro-optical performance of the device.

In accordance with the invention, an optical device assembly comprises a planar first optical component, preferably a filter, and a planar second optical component, preferably a sensor having an optically active area, with the first optical component being positioned in a facing relationship to the second optical component and with a gap therebetween. A standoff structure extends between the first optical component and the second optical component and bonds the first optical component and the second optical component together. The standoff structure contacts the second optical component at a location outside of its optically active area.

The standoff structure preferably comprises a standoff, a first bonding element disposed between the standoff and the first optical component, and a second bonding element disposed between the standoff and the second optical component. The second bonding element is at a location outside of the optically active area of the second optical component. The standoff is made of a sufficient height to provide the necessary clearance between the first and second optical components.

The first bonding element and the second bonding element preferably include a deformable metal such as indium that is bondable to the respective adjacent structural elements by cold welding. In some cases, however, at least one of the adjacent structural elements is made of a material that does not cold weld to indium. In such a case, a bonding pad is first deposited, prior to cold welding, on the structural element that does not cold weld to indium to facilitate the cold welding process. An operable bonding pad is titanium/nickel. For example, in a case of interest to the inventors, the standoff is silicon, and a titanium/nickel bonding pad is provided on those surfaces of the bonding pad which face the indium.

The approach of the invention provides an advance in the art of fabrication and assembly of optical devices in which two components in an optical train must be bonded together. The assembly cost is reduced due to a reduction in the bonding time. Tolerances are improved due to the stability of a metal bonding element as compared with a cured adhesive, which can distort as it cures. Optical performance is improved because no adhesive lies in the optical path, and the components are separated only by a gap. Long-term stability of the device is improved because no adhesive touches the faces of either of the components.

Other features and advantages of the present invention will be apparent from the following more detailed description of the preferred embodiment, taken in conjunction with the accompanying drawings, which illustrate, by way of example, the principles of the invention.

BRIEF DESCRIPTION OF THE DRAWINGS

FIG. 1 is a schematic sectional view of an optical device assembly fabricated according to the approach of the invention;

FIG. 2 is a detail of FIG. 1, showing the standoff structure;

DETAILED DESCRIPTION OF THE INVENTION

Figure 3:
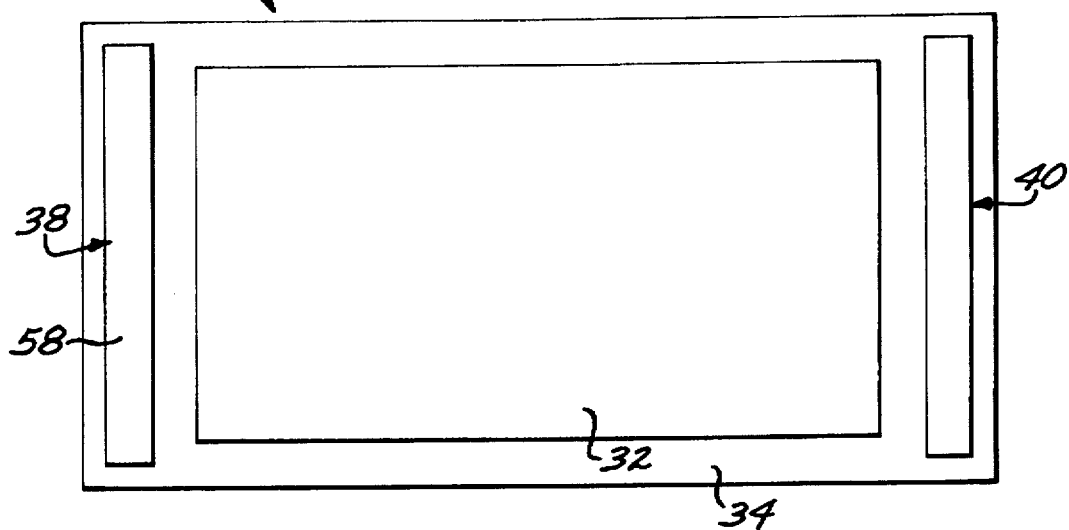
FIG. 3 is a bottom view of the first optical component, prior to final assembly, taken along line 3—3 of FIG. 2.

FIG. 1 depicts an optical device 20 prepared by the present approach. The optical device 20 includes a first optical component 22 and a second optical component 24. The optical components 22 and 24 are planar in form. As used herein, "planar" means that the device has a greater lateral (x-y) extent than thickness (z), and that there is a dominant plane defined by the x-y directions to which most of the features of the component are parallel. There may be some non-planar features, but the component is predominantly planar.

In the presently preferred case, the first optical component 22 is a proximal optical filter formed of a substrate which can have various types of thin film coatings deposited thereon to serve particular optical filtering functions. The second optical component 24 is preferably a sensor that detects and reads out the intensity of the light that passes through the first optical component 22 and reaches the second optical component 24. In the presently preferred case, the second optical component 24 comprises a detector layer 26 of a material such as mercury cadmium telluride (HCT) coated with an anti-reflective coating that detects incident light by converting it to an electrical signal. The detector layer 26 is relatively thick, on the order of 0.001 inch or more. A readout layer 28 lies below but adjacent to the detector layer 26 and comprises a CMOS material which senses the electrical voltage. The readout layer 28 is electrically connected to the detector layer 26 by an indium/epoxy interconnect 30. The individual structures and fabrication of these components are well known in the art, and are described in R. M. Hoendervooght, K. A. Kormos, J. P. Rosbeck, J. R. Toman, and C. B. Burgett, "Hybrid InSb Focal Plane Array Fabrication", *IEDM Tech. Dig.*, page 510 (1978). The first optical component 22 and second optical component 24 preferably have the described structures because that is the principal interest of the inventors. However, the invention is not limited to this preferred case, and can be used more generally.

A characteristic of the second optical component 24 is that it has an optically active area 32, normally in the center of the component, with the remainder of the surface being an optically inactive area 34. That is, the optically active area 32 has both the detector and readout structure to enable it to function for its intended light sensing purpose, and is aligned with an operable region 32' of the first optical component 22. The optically inactive area 34 is usually found, as depicted, at the edges of the component and is optically inactive because at least some of the structure required for the optical functioning is absent or because it is not aligned with an operable area of the first optical component 22. The optically inactive area 34 is available for use for interconnect, support, and other subsidiary but necessary functions. The distinction between the optically active area 32 and the optically inactive area 34 is important because any joining structure placed into the optically active area 32 potentially interferes with the functioning of the device.

The first optical component 22 and the second optical component 24 are separately fabricated and joined by a standoff structure 36, shown in greater detail in FIG. 2, which is not drawn to scale. The joining means includes a standoff 38 in the form of a column extending between the first optical component 22 and the second optical component 24 (except for the bonding elements at each end of the standoff 38). The standoff 38 is sufficiently long that the optical components 22 and 24 are separated by a sufficient spacing that the detector layer 26 fits between the two components and there is a gap as well. The standoff 38 is positioned outside the optically active area 32, in the optically inactive area 34 of the second optical component 24. There is a first bonding element 40 extending between a first face 42 of the standoff 38 and a first face 44 of the first optical device 22. Similarly, there is a second bonding element 46 extending between a second face 48 of the standoff 38 and a second face 50 of the second optical device 24. The standoff 38 can have any operable shape and form. In FIGS. 1 and 2, the standoff 38 is depicted as a regular column, but it may be bowed, slanted, or otherwise irregular in shape, as long as it provides sufficient joining strength. When viewed perpendicular to the plane of the components 22 and 24 as in FIGS. 3 and 4, the standoff 38 is preferably an elongated strip or bead, but it can be of any other operable form.

Each of the bonding elements 40 and 46 includes a deformable metallic element 52 and 54, respectively, that is capable of cold welding at relatively low applied pressures. The preferred deformable metal is indium, so that cold welded joints can be made to join the opposite ends of the standoff 38 by the deformable metallic elements 52 and 54 to the respective components 22 and 24. That is, under many circumstances the deformable metallic elements 52 and 54 are cold-weld bonded directly to the optical devices 22 and 24 and to the standoff 38 by placing the elements 52 and 54 in the proper positions and applying a sufficient pressure at ambient temperature, while simultaneously the indium metal deforms to the desired height.

Figure 4:
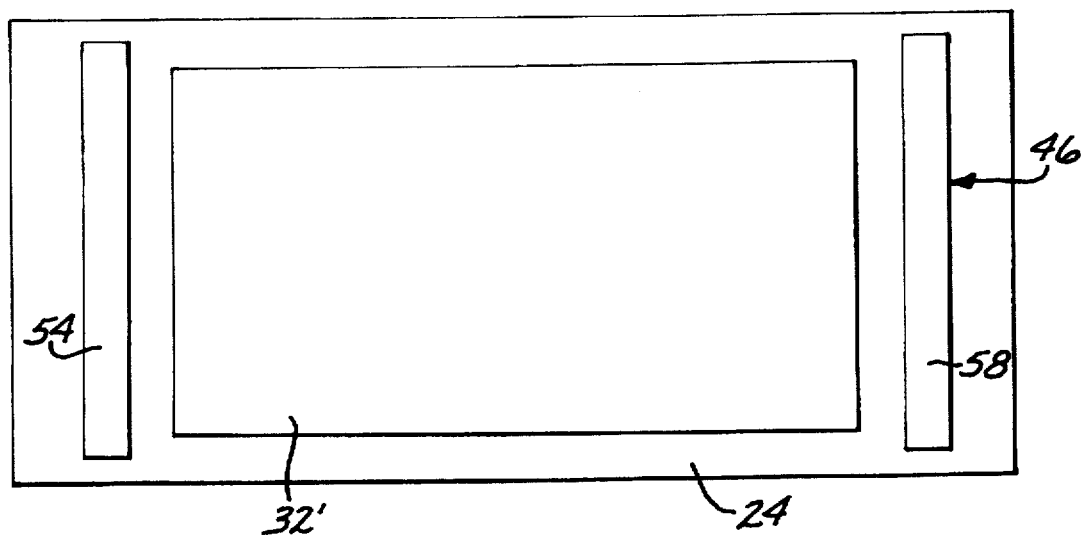
FIG. 4 is a top view of the second optical component, prior to final assembly, taken along line 4—4 of FIG. 2.

In some instances, the deformable metallic element such as indium does not readily cold weld to one or more of the materials forming the first optical component 22, the second optical component 24, or the standoff 38. In one presently preferred embodiment of the invention, the standoff 38 is preferably formed of silicon, to which indium does not readily cold weld. In this case, which can be used as an illustrative example and also reflects one preferred embodiment, the metallic elements 52 and 54 readily bond to the respective first optical component 22 and second optical component 24. To facilitate the bonding of the metallic elements 52 and 54 to the standoff 38, the respective faces 42 and 48 of the standoff 38 are provided with a respective bonding pad 56 and 58. The bonding pads 56 and 58 are preferably titanium/nickel (Ti/Ni) deposited on the respective faces 42 and 48 by metal film sputtering or metal film evaporation. The bonding pads 56 and 58, when present, are preferably from about 1000 Angstroms to about 5000 Angstroms thick. Indium metal does readily cold weld to titanium/nickel. As shown in FIGS. 3 and 4, the bonding elements 40 and 46 are shaped and positioned to be in facing alignment with each other.

Figure 5:
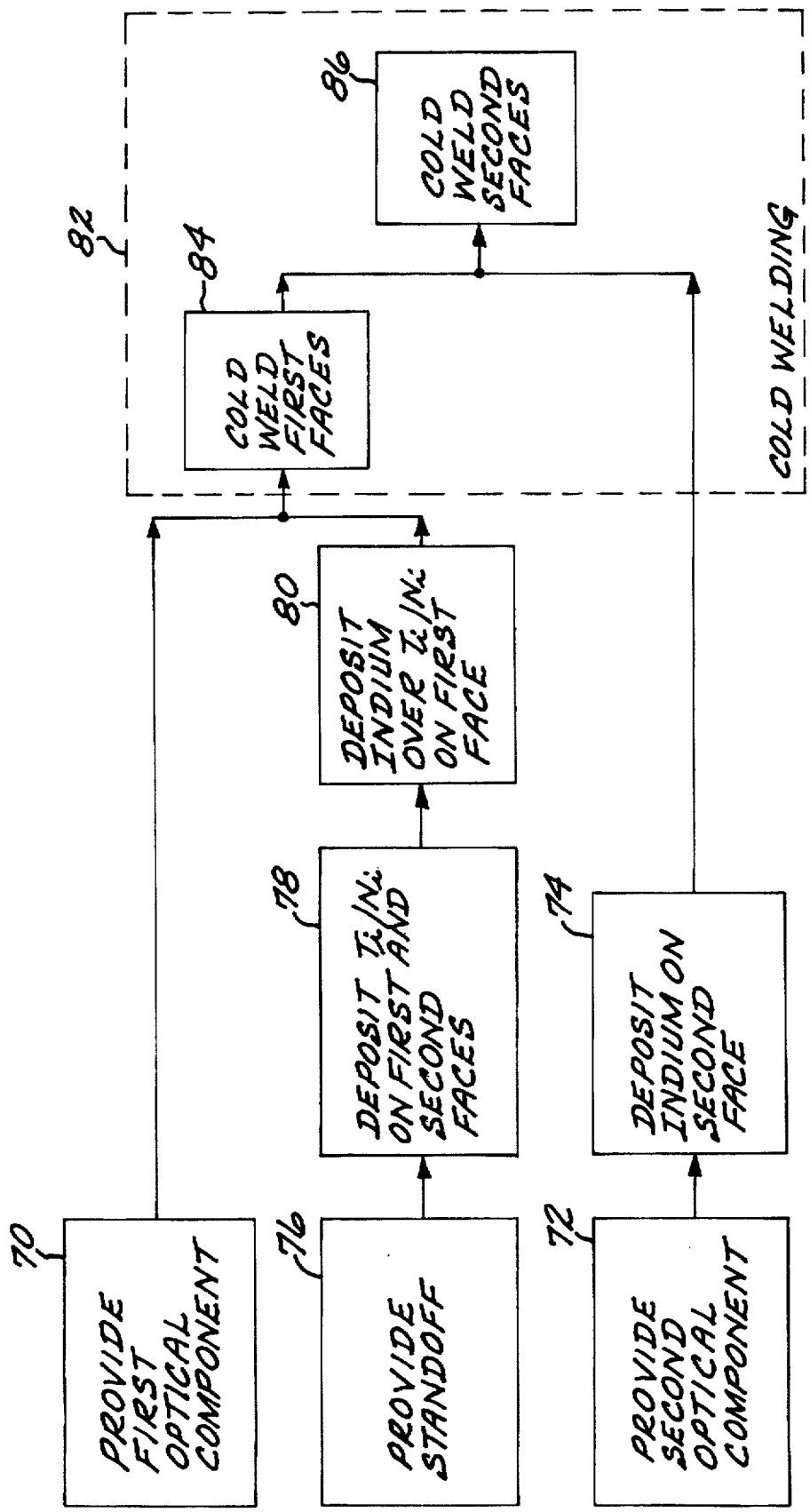
FIG. 5 is a process flow diagram for the approach of the invention.
Figure 6:
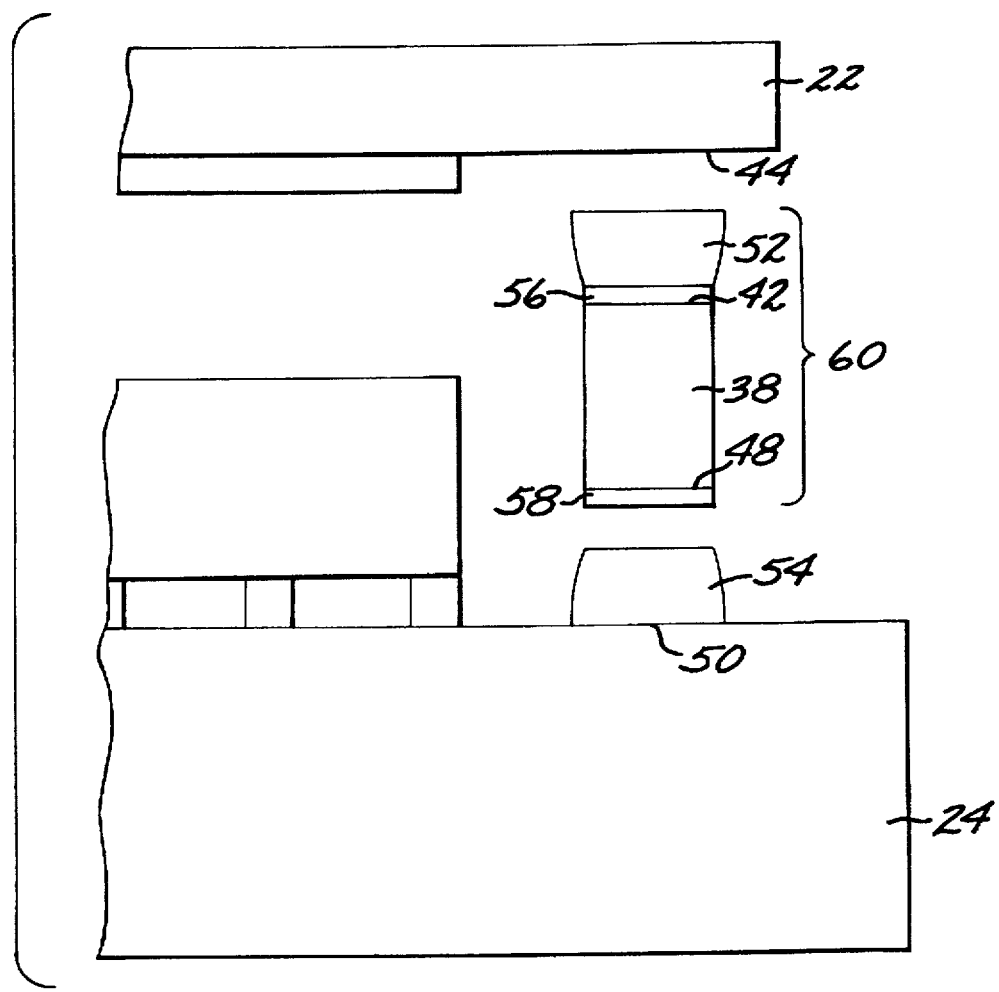
FIG. 6 is an exploded schematic sectional view of the optical device assembly detail of FIG. 2, prior to final assembly.

FIG. 5 is a process flow diagram for a preferred approach for preparing the assembly of the optical device 20, and FIG. 6 depicts the components in an exploded view that shows the associated elements during the bonding operation. The first optical component 22 is provided, numeral 70.

The second optical component 24 is provided, numeral 72. A layer of the deformable metal 54, preferably indium, is deposited on the second face 50 of the second optical component 24, numeral 74, preferably by thermal deposition to a thickness of about 3 micrometers to about 6 micrometers. The standoff 38 is provided, numeral 76. The bonding pads 56 and 58, when used, are deposited on the respective faces 42 and 48, numeral 78. The bonding pads are preferably titanium/nickel in a thickness of from about 1000 Angstroms to about 5000 Angstroms, and are deposited by sputtering or evaporation. A layer of the deformable metal 52, preferably indium, is deposited over the titanium/nickel bonding pad 56 on the first face 42, numeral 80, preferably by thermal deposition to a thickness of about 3 micrometers to about 6 micrometers. The elements 52, 56, 38, and 58 form a discrete piece 60. At this point, the three pieces 22, 24, and 60 depicted in the exploded view of FIG. 6 are ready for assembly and joining.

The three pieces 22, 24, and 60 depicted in FIG. 6 are cold welded together, numeral 82. To do so, the three pieces are carefully arranged in an aligned, facing relationship as shown in FIG. 6, taking care that the standoff element resides in the optically inactive areas of the pieces 22 and 24. The precise positioning of the components 22 and 24 relative to each other, both in the lateral and spacing directions, is normally aided by the use of appropriate tooling and inspection. The pieces 22, 24, and 60 are pressed together to effect cold welding at ambient temperature. There are two joints formed during pressing, one adjacent the first faces, numeral 84, and the other adjacent the second faces, numeral 86. Normally, both joints are formed in the single pressing operation 82, but two sequential pressing operations 84 and 86 may be used if more convenient. In either case, two joints are formed.

Indium has the property that it can be readily cold welded to itself and some other materials, such as Ti/Ni, at ambient temperature under moderate pressures, and for this reason is preferred as the material of the deformable metallic element metallic bump. The applied pressure is preferably about 40 pounds at the bonded region to accomplish the cold welding. During the pressing step 82, the material of the metallic element deforms compressively under the applied pressure. The resulting spacing between the pieces 22 and 24 is determined by the tooling, which limits the extent of the height reduction during pressing. In the preferred case, as the deformable metal deforms to its final thickness, the spacing between the components 22 and 24 is reduced, until it reaches a final spacing with a gap 62 (FIG. 1) between the first component 22 and the detector layer 26 of the second component 24. In the presently preferred application, the gap 46 has a thickness dimension of from about 25 to about 150 micrometers.

Figure 7:
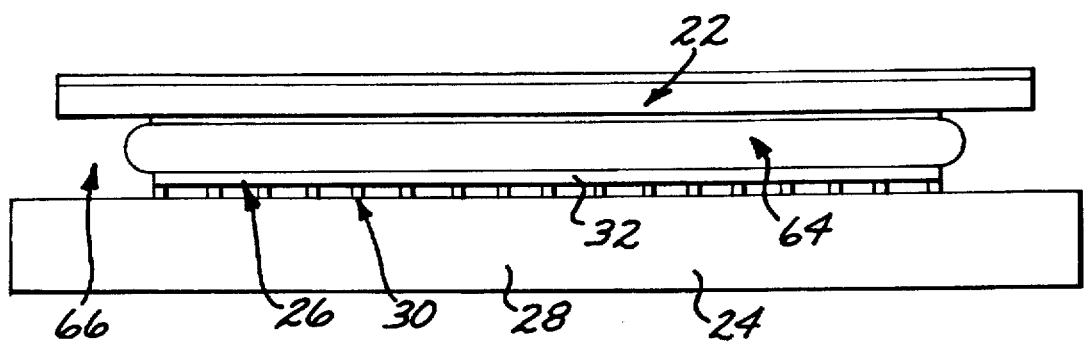
FIG. 7 is an sectional view of an optical device assembly fabricated according to the prior approach.

The approach of the present invention may be contrasted with the prior approach by comparing FIG. 1, the present approach, and FIG. 7, the prior approach. In FIG. 6, the same components 22 and 24 are used. In joining the components 22 and 24 together, a mass 64 of a curable adhesive such as an epoxy is placed between the components 22 and 24. The mass of adhesive 64 covers all or a major portion of the optically active area 32 of the second component 24. The components are pressed together to adjust their spacing to the desired value, and the mass is cured in place. No bonding structure is present in a peripheral region 66.

The present approach accomplishes the assembly and bonding using the standoff structure approach in less than one hour, while the prior approach requires 12 hours of curing with the spacing and positioning of the components maintained as precisely as possible. Even then, with the prior approach the best lateral (x-y) tolerance that can be achieved is ±25 to 250 micrometers and the best spacing tolerance that can be achieved is ±10 micrometers, due to the dimensional changes inherent in the curing of the adhesive and the large coefficient of thermal expansion of the adhesive. With the present approach, a lateral tolerance of ±10 micrometers and a spacing tolerance of less than 2 micrometers are achieved because, once deformed and bonded, the metallic bump changes dimensions very little.

The present approach also places no foreign matter such as bonding material in contact with the active layers of the components. By contrast, the adhesive mass 64 of the prior approach places the adhesive across the entire facing surfaces of the two components. It is known that such contact of a foreign substance can lead to long-term degradation in the performance of the components due to stresses and other factors. Lastly, the presence of a foreign material in the adhesive mass 64 can spectrally absorb and reflect the light as it travels to the second component, inasmuch as it is in the optical path of the device. No such interference is present in the device of the invention. The gap 62 can be filled with air or vacuum, if the entire device is operated within an evacuated space.

The present invention has been tested on a simulated optical device. The first optical component was simulated by a structure of a silicon substrate and BK-7 glass. The second optical component was simulated by a silicon substrate. Bonding was successfully accomplished according to the procedure set forth hereinabove.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An optical device assembly, comprising:
   a planar optical filter having a first face;
   a planar sensor having a second face and an optically active area;
   standoff structure means for joining the optical filter to the sensor with a gap therebetween, the standoff structure means comprising
   a standoff extending between the optical filter and the sensor;
   a first bonding element disposed between the standoff and the first face of the optical filter, and
   a second bonding element disposed between the standoff and the second face of the sensor, the second bonding element being at a location outside of the optically active area of the planar sensor,
   at least one of said first bonding element and said second bonding element comprising a cold-weldable metallic bump.

2. The assembly of claim 1, wherein the standoff is made of silicon.

3. The assembly of claim 1, wherein the first bonding element comprises a bump of a deformable metal.

4. The assembly of claim 1, wherein the first bonding element comprises a bump of indium.

5. The assembly of claim 1, wherein the second bonding element comprises a bump of a deformable metal.

6. The assembly of claim 1, wherein the second bonding element comprises a bump of indium.

7. The assembly of claim 1, wherein the second bonding element comprises
   a pad contacting the standoff, and
   a bump of a deformable metal between the pad and the planar sensor.

8. The assembly of claim 1, wherein the planar sensor comprises
   a readout layer,
   a detector layer, and
   an electrical interconnect between the readout layer and the detector layer, the second face of the sensor being on the readout layer and the gap lying between the detector layer and the first face of the optical filter.

9. An optical device assembly, comprising:

a planar first optical component;

a planar second optical component having an optically active area, the first optical component being positioned in a facing relationship to the second optical component with a gap therebetween; and a standoff structure extending between the first optical component and the second optical component and bonding the first optical component and the second optical component together, the standoff structure contacting the second optical component at a location outside of its optically active area;.

wherein the standoff structure comprises a standoff, a first bonding element disposed between the standoff and the first optical component, and a second bonding element disposed between the standoff and the second optical component, the second bonding element being at a location outside of the optically active area of the second optical component at least one of said first bonding element and said second bonding element comprising a cold-weldable metallic bump.

10. The assembly of claim 9, wherein the first optical component is a filter and the second optical component is a sensor.

11. The assembly of claim 9, wherein the second bonding element comprises a pad contacting the planar sensor, and a bump of deformable metal between the pad and the standoff.

12. The assembly of claim 9, wherein the first bonding element comprises a bump of a deformable metal.

13. The assembly of claim 9, wherein the first bonding element comprises a bump of indium.

14. The assembly of claim 9, wherein the second bonding element comprises a bump of a deformable metal.

15. The assembly of claim 9, wherein the second bonding element comprises a bump of indium.

16. A method for preparing an optical device assembly, comprising the steps of:

furnishing a planar first optical component having a first optically active area;

furnishing a planar second optical component having a second optically active area;

bonding the first optical component to the second optical component using a standoff structure, the standoff structure including a standoff extending between the first optical component and the second optical component;

a second bonding element disposed between the standoff and the second optical component, the second bonding element being at a location outside of the second optically active area, at least one of said first bonding elements and said second bonding element comprising a cold-weldable metallic bump.

17. An optical device assembly prepared by the method of claim 16.

* * * * *